United States Patent [19]
Hatfield et al.

[11] Patent Number: 5,904,863
[45] Date of Patent: May 18, 1999

[54] PROCESS FOR ETCHING TRACE SIDE WALLS

[75] Inventors: Michael M. Hatfield, Mesa; Marshall I. Gurian, Tempe, both of Ariz.

[73] Assignee: Coates ASI, Inc., Phoenix, Ariz.

[21] Appl. No.: 08/848,312

[22] Filed: Apr. 30, 1997

[51] Int. Cl.$^6$ ............................... B44C 1/22; C03C 15/00
[52] U.S. Cl. ............................ 216/92; 216/105; 216/106
[58] Field of Search ........................... 216/92, 105, 106; 156/345

[56] References Cited

U.S. PATENT DOCUMENTS

| | | | |
|---|---|---|---|
| 4,357,196 | 11/1982 | Tanaka et al. | 134/64 R |
| 5,308,447 | 5/1994 | Lewis et al. | 156/626 |
| 5,591,299 | 1/1997 | Seaton et al. | 156/626.1 |
| 5,665,200 | 9/1997 | Fujimoto et al. | 438/694 |

FOREIGN PATENT DOCUMENTS

| | | |
|---|---|---|
| 262247 | 11/1988 | German Dem. Rep. . |
| 58-171572 | 10/1983 | Japan . |
| 5-025660 | 2/1993 | Japan . |

OTHER PUBLICATIONS

"Optimization of The Ferric Chloride Etching of Shadow Masks"; Moscony et al.; J. of the Society For Info. Display; vol. 4; No. 4; pp. 231–239, Dec. 1996.

*Primary Examiner*—Benjamin Utech
*Assistant Examiner*—George Goudreau
*Attorney, Agent, or Firm*—Tod R. Nissle, P.C.

[57] ABSTRACT

A process for etching the sides of a trace remove the feet which extend laterally out from the sides and over a circuit board substrate adjacent the trace.

2 Claims, 1 Drawing Sheet

PROCESS FOR ETCHING TRACE SIDE WALLS

This invention relates to processes for etching traces on a circuit board substrate.

More particularly, the invention relates to a process for etching the sides of a trace to remove the "feet" which extend laterally out from the sides and over the circuit board substrate adjacent the trace.

Processes for depositing layers of copper or other electrically conductive materials on a substrate, for applying a photoresist pattern, and for then etching away the areas of copper which are bounded and not covered by the photoresist pattern are well known in the art. After such etching is completed, thin strips of copper called traces remain. The traces are situated beneath the photoresist pattern and contact and extend over the substrate. The photoresist pattern is subsequently removed during later processing steps.

One problem associated with forming copper traces is that the etchant utilized to dissolve the copper intermediate the traces does not produce traces having flat sides which are perpendicular to the substrate. Instead, each side of the trace flares out, producing a "foot" which extends laterally out over the substrate and away from the layer of photoresist which caps and protects the trace. The feet of a trace become more of a problem when the traces desired on a substrate are close together. When the traces are close together, the distal edge of a foot on one trace can contact the distal edge of a foot on another trace, shorting out the electrical circuit of which the traces each subsequently comprise a part. One approach for minimizing the distance that a foot extends laterally out away from a trace is simply to leave the etchant solution on for a longer period of time. The problem with this approach is that the etchant continues to dissolve the portion of the trace directly beneath the photoresist, resulting in a trace which is thinner than desired and which tends to overheat when carrying electrical current.

Accordingly, it would be highly desirable to provide an improved process for removing the foot of a trace while minimizing the amount of the trace which is removed above the foot and adjacent the photoresist which caps the trace.

Therefore, it is a principal object of the invention to provide an improved process for etching traces on a circuit board substrate.

Another object of the invention is to provide an improved etching process which produces traces which do not have feet extending laterally from the trace and which have the greatest possible thickness adjacent the photoresist capping the trace.

These and other, further and more specific objects and advantages of the invention will be apparent to those skilled in the art from the following detailed description thereof, taken in conjunction with the drawings, in which.

Briefly, in accordance with the invention, we provide an improved process for producing a trace on a circuit board panel. The circuit board panel includes a substrate; an electrically conductive layer formed on the substrate, the layer being dissolvable by a selected primary etchant; and, a photoresist layer contacting and covering a portion of the electrically conductive layer. The photoresist layer is resistant to the primary etchant. The improved process includes the steps of providing a primary etchant which when contacted with the electrically conductive layer dissolves the electrically conductive layer at a rate in the range of 0.25 to 1.00 microns per second; applying the primary etchant to the electrically conductive layer to dissolve portions of the electrically conductive layer not covered by the photoresist layer to produce a trace beneath the photoresist layer, the trace having at least one side and a foot extending laterally out from the side and over the substrate; providing a secondary etchant which when contacted with the electrically conductive layer dissolves the electrically conductive layer at a rate in the range of 0.01 to 0.10 microns per second; and, applying the secondary etchant to the circuit board panel to reduce the size of the foot.

In another embodiment of the invention, we provide an improved process for producing a trace on a circuit board panel. The circuit board panel includes a substrate; an electrically conductive layer formed on the substrate, the layer being dissolvable by a selected primary etchant; and, a photoresist layer contacting and covering a portion of the electrically conductive layer. The photoresist layer is resistant to the primary etchant. The improved process includes the steps of providing a primary etchant which when contacted with the electrically conductive layer dissolves the electrically conductive layer at a first dissolution rate; spraying the primary etchant on the electrically conductive layer to dissolve portions of the electrically conductive layer not covered by the photoresist layer to produce a trace beneath the photoresist layer, the trace having at least one side and a foot extending laterally out from the side and over the substrate; providing a secondary etchant which when contacted with the electrically conductive layer dissolves the electrically conductive layer at a second dissolution rate slower than the first dissolution rate; and, spraying the secondary etchant on the circuit board panel to reduce the size of the foot.

Figure 1:
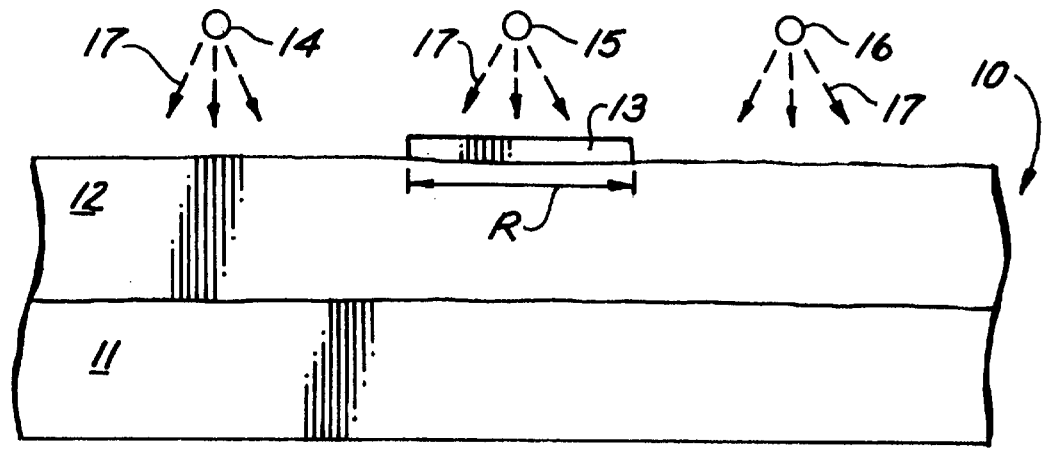
FIG. 1 is a side view illustrating the edge of a circuit board substrate including photoresist applied to an electrically conductive layer.

Turning now to the drawings, which depict the presently preferred embodiments of the invention for the purpose of illustrating the practice thereof and not by way of limitation of the scope of the invention, FIG. 1 illustrates a circuit board panel 10 including a substrate 11, layer 12 of material, and layer 13 of photoresist material. The thickness and pliability of panel 10 can vary as desired. For example, panel 10 can be quite thin and comprise a pliable sheet, or can be a thicker, rigid panel. Substrate 11 can comprise any desired material, but epoxy and glass are often utilized. Layer 12 can comprise any desired material, but typically consists of an electrically conductive material like copper. Layer 12 can be dissolved by a selected etchant. Photoresist layer 13 has a width indicated by arrows R and comprises photoresist material or any other desired material which resists attack by the etchants utilized to dissolve layer 12. Processes for applying photoresist layers and layers 13 of other materials are well known in the art and will not be detailed herein. Similarly, processes for manufacturing substrate 11 and applying layer 12 are well known in the art.

In FIG. 1, a primary etchant 17 is directed against layer 12 by spray nozzles 14 to 16. Etchant 17 does not dissolve layer 13 but does dissolve layer 12 to produce a trace 12A beneath layer 13. Trace 12A is the portion of layer 12 remaining after the primary etchant is applied.

Figure 2:
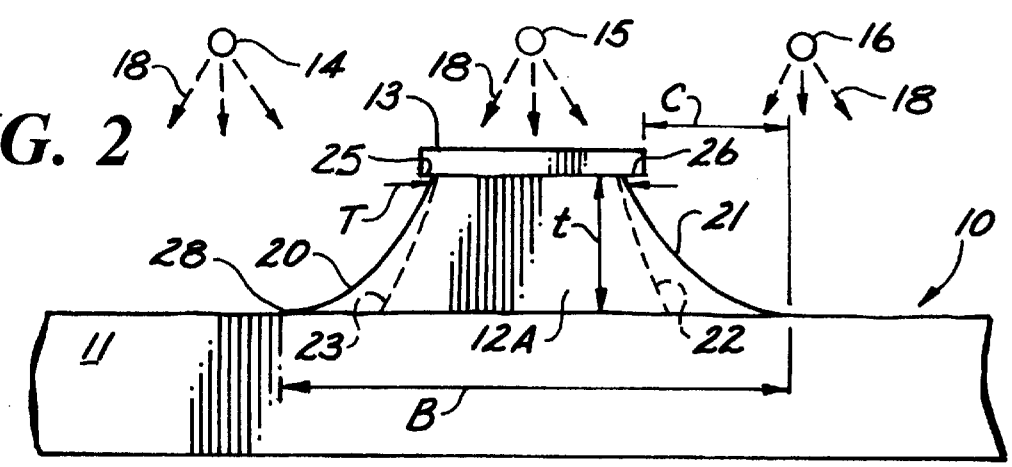
FIG. 2 is side view illustrating the circuit board substrate of FIG. 1 after a trace has been produced by applying an etchant to remove portions of the electrically conductive layer adjacent the trace and not protected by the photoresist; and, FIG. 3 is a side view illustrating the circuit board substrate of FIG. 2 after a supplemental etchant has been applied to remove the feet from the trace.

FIG. 2 illustrates the appearance of panel 10 after the primary etchant has been applied and removed (typically by washing with water) from panel 10. Ideally, the sides of a trace are flat and are perpendicular to substrate 11. In practice, however, the trace 12A in FIG. 2 does not have flat sides 20, 21 which are perpendicular to substrate 11. Instead the sides 20, 21 extend arcuately laterally outwardly from beneath layer 13 and taper or feather into substrate 11. The portion of side 20 which extends laterally out from beneath layer 13 is called a foot. The portion of side 21 which extends laterally out from beneath layer 13 is also called a foot.

The height of trace 12A is indicated by arrows t in FIG. 2. The greatest distance between the distal ends of the feet of trace 12A is indicated by arrows B. The distance between the distal end of the foot associated with wall 12 and the nearest edge of layer 13 is indicated by arrows C. The thickness of trace 12A adjacent the underside of layer 13 is indicated by arrows T. Outer edge 25 of layer 13 extends out over the top of wall 20, i.e., the point at which the top of wall 20 contacts layer 13 is ordinarily (but not necessarily) inset from edge 25. Outer edge 26 of layer 13 extends out over the top of wall 21, i.e., the point at which the top of wall 21 contacts layer 13 is ordinarily (but not necessarily) inset from outer edge 26.

In FIG. 2, a secondary etchant 18 is applied by spray nozzles 14 to 16. As would be appreciated by those of skill in the art, the secondary etchant can be applied in the same processing chamber as the primary etchant or can be applied in a separate processing chamber. The secondary etchant 18 functions to remove a portion, preferably a substantial portion of all, of the feet extending laterally out from beneath photoresist 13 such that trace 12A becomes the trace 12B illustrated in FIG. 3. The sides 22, 23 of trace 12B include feet which extend out from beneath layer 13 a much shorter distance D than the feet associated with trace 12A. The thickness S of trace 12B adjacent the underside of layer 13 is less than the thickness T of trace 12A. Typically thickness S is only slightly less than thickness T.

As can be seen in FIG. 2, after etchant 18 is applied, the amount or thickness of material which etchant 18 has removed from side 20 near the bottom of trace side 20 is greater than the amount removed from side 20 near layer 13. This is believed to be the case because, edge 25 at least initially shields the portion of side 20 near layer 13 from spray 18 and because etchant 18 has, in a sense, two "surfaces" to act on when attacking the foot of side 20. The etchant 18 attacks the outermost distal end or edge 28 of the foot of side 20 and also attacks the portion of the arcuate surface of side 20 which extends down over the top of the foot. One approach to maximizing the degradation by etchant 18 of the feet on trace 12A and to minimizing the degradation by etchant 18 of the portion of a side 20 near layer 13 is to mist on a quantity of etchant which does not completely immerse trace 12B but which does immerse the feet of trace 12A. Since in practice this may be difficult to accomplish, it is an acceptable and common practice of the invention eventually to apply a spray which completely immerses trace 12A in etchant 18. The amount of material removed from sides 20 and 21 when the secondary etchant is applied is, for purposed of clarity, exaggerated in FIGS. 2 and 3.

The primary etchant is a relatively fast-acting etchant which dissolves layer 13 at a rate in the range of 0.25 to 1.00 microns per second, preferably 0.30 to 0.80 microns per second. Examples of typical primary liquid etchants are, without limitation, industry standard etchants like cupric chloride, ferric chloride, and alkaline or ammoniacal etchant (which includes ammonia). These etchants are, when applied to a circuit board substrate, normally heated to an industry standard temperature in the range of about 120 to 130 degrees F., although temperatures outside of this range can be utilized.

The time period during which the primary etchant contacts layer 13 can vary as desired. By way of example, and not limitation, for a 1.4 mil thick layer of copper ("one ounce" copper), cupric chloride etchant is typically applied to a circuit board panel 10 for about one hundred to one hundred and twenty seconds. As is well known, the appropriate contact time or "dwell time" of primary etchant on layer 13 can vary and is readily determined by experimentation.

In one embodiment of the invention, the dwell time of the primary etchant is less than normal, so that layer 13 is underetched. The secondary etchant 18 then completes the etching process while also removing a substantial portion of the feet from trace 12A without significantly reducing the thickness T of trace 12A.

The secondary etchant is a relatively slow-acting etchant which dissolves layer 13 at a rate in the range of 0.01 to 0.10 microns per second, preferably 0.03 to 0.075 microns per second. Examples of secondary etchants are, without limitation, industry standard etchants like sodium persulfate, like a solution of hydrogen peroxide and sulfuric acid, and like various other proprietary derivations of these etchants. These etchants are, when applied to a circuit board substrate, normally heated to an industry standard temperature in the range of about 80 to 120 degrees F., although temperatures outside of this range can be utilized.

The time period during which secondary etchant 18 contacts trace 12A can vary as desired. By way of example, and not limitation, when layer 13 on panel 10 consists of a 1.4 mil thick layer of copper ("one ounce" copper), the sodium persulfate etchant is typically in contact with trace 12A for about sixty seconds.

We have discovered that the dichotomy of utilizing a fast acting primary etchant and a slow acting secondary etchant is critical in the practice of the invention. The secondary etchant appears, for reasons which we theorize below, to somewhat selectively attack the feet of trace 12A at a greater rate than it attacks the substantially vertical faces of trace 12A which are adjacent and extend down from layer 13.

If the width R of photoresist 13 is, for example, five mils, and layer 13 has a thickness, t, of about 1.4 mils, then after the primary etchant 17 is applied, the thickness T of the trace 12A adjacent layer 13 may be four and a half mils, while the thickness B of the feet of trace 12A is about five and a half mils. The thickness T is often about one mil less than the thickness B. The generally trapezoidal shape of trace 12A is well known in the art.

After the secondary etchant 18 is applied in accordance with the invention, the distance B between the distal ends of the feet of trace 12B is typically five mils or less, while the distance T is still about 4.5 mils. This ability of the secondary etchant 18 to selectively dissolve the feet of trace 12A at a greater rate than the portion of trace 12A adjacent layer 13 is believed to be due at least in part to two factors, the "nook phenomenon" and the "shield phenomenon" alluded to above.

In the shield phenomenon, the outer edges of layer 13 extend out over the upper portions of sides 20 and 21 and shield them from etchant being sprayed onto panel 10.

In the nook phenomenon, etchant which manages to travel into an "inverted L" shaped "nook" formed by one of the outer edges or "overhangs" 25, 26 of layer 13 and by the adjacent upper portion of one of the sides 20 and 21 tends—due to surface tension, due to the lack of liquid circulation in the nook, or possibly due to an air bubble trapped in the nook—to stay in the nook. This etchant rapidly weakens as it acts on trace 12A and, since it is not replenished with fresh etchant or is replaced only slowly with fresh etchant, dissolves the top portion of side 20 or 21 at a greatly reduced rate. In contrast, the spray from nozzles 14 to 16 acts to replace continuously the secondary etchant contacting the feet of trace 12A with fresh etchant to promote the dissolution of such feet. It is believed the effect of the nook phenomenon is minimized when the primary etchant is utilized because the primary etchant is a stronger etchant and acts more rapidly on the sides of trace 12A.

In use, the quantity and location of spray nozzles 14 to 16 is selected to insure that points on the horizontally oriented floor of panel 10 each continuously receive and are contacted at a uniform flow rate by fresh etchant dispensed by spray nozzles 14 to 16. One important function of the spray from nozzles 14 to 16 is to wash away old etchant and contact panel 10 with fresh etchant.

The primary and secondary etchant can be applied to panel 10 either when panel 10 is dry or after panel 10 has been rinsed clean with water and is still wet.

The pressure of primary etchant spray dispensed by nozzles 14 to 16 is presently in the range of twenty-two to thirty psi. The pressure of secondary etchant spray dispensed by nozzles 14 to 16 is presently in the range of eighteen to twenty-four psi. As would be appreciated by those of skill in the art, the pressure of primary and secondary etchant sprays can vary outside of these ranges, in particular because the conveyor speed (if a conveyor is used to transport panel 10 while etchant spray is applied to panel 10), spray temperature, and spray pressure are adjusted relative to one another in achieving the desired etching results. Regardless of whether panel 10 is moving or is stationary while an etchant 17, 18 spray is applied, one important function of the spray is to continuously apply and circulate fresh etchant over the exposed surfaces of panel 10. The more effective nozzles 14 to 16 are at maintaining fresh etchant in contact with at least the horizontal surfaces or "floor" of panel 10, the more effectively layer 12 and the feet of trace 12A are dissolved. And, as noted, while continuously contacting the generally horizontally oriented feet of trace 12A with fresh secondary etchant is desirable, the same is not desirable with respect to the upper "vertical" portion (as they appear in FIG. 2) of sides 20 and 21 adjacent layer 13. The spray application of secondary etchant appears to minimize the circulation of fresh etchant adjacent the underside of layer 13 and to facilitate such a diminished contact of secondary etchant with the upper portions of sides 20 and 21.

Figure 3:
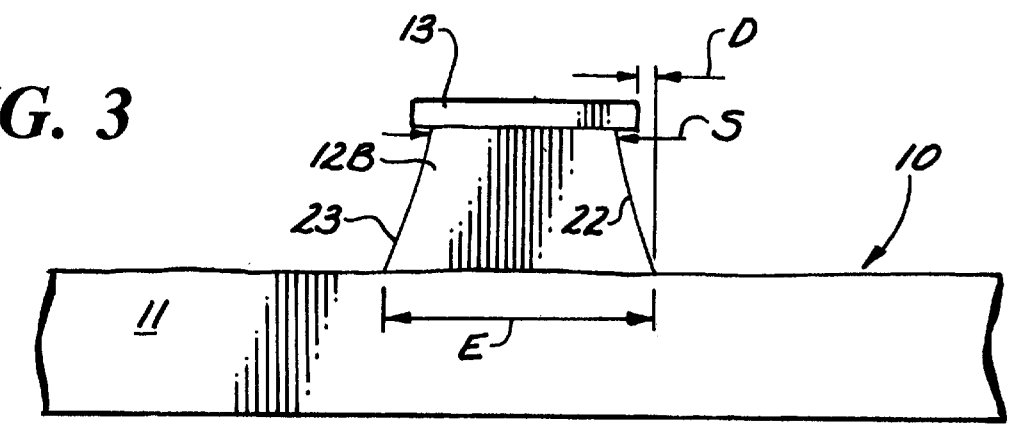

While the feet of trace 12A and the floor consisting of substrate 11 are horizontally oriented in FIG. 2, and while the upper portions of sides 20 and 21 are vertically oriented in FIG. 2, it is understood that panel 10 need not be in the horizonal orientation shown in FIGS. 1 to 3 while it is processed. The orientation of panel 10 during processing can vary as desired.

The layer 13 is resistant to both the primary and secondary etchants and functions to shield the top of trace 12A from such etchants during the processing of panel 10. The primary and secondary etchants can be applied utilizing any desired application process and equipment including, by way of example and not limitation, spray processes, flood techniques, laminar flow bars, FLUID HEADS (IBM Tradmark), vertical conveyor etching, and dip tanks.

As utilized herein, one mil equals one thousandth of an inch.

One advantage of the process of the invention is that it reduces over the length of a foot the deviation in the distance the foot extends out from a trace and over substrate 11. It is theoretically believed that this reduction in deviation is due both to the geometric effect of making the foot more vertical and to etching out copper from the "valleys" in the substrate 11 on which the trace rests.

Having described our invention in such terms as to enable those skilled in the art to understand and practice it, and having described the presently preferred embodiments thereof, we claim:

1. A process for producing a trace on a circuit board panel, said circuit board panel including a substrate, an electrically conductive layer formed on the substrate, said layer being dissolvable by a selected primary etchant, and a photoresist layer contacting and covering a portion of said electrically conductive layer, said photoresist layer being resistant to said primary etchant, said process including the steps of:

(a) providing a primary etchant which when contacted with said electrically conductive layer dissolves said electrically conductive layer at a rate in the range of 0.25 to 1.00 microns per second;

(b) applying said primary etchant to said electrically conductive layer to dissolve portions of said electrically conductive layer not covered by said photoresist layer to produce a trace beneath said photoresist layer, said trace having at least one side and a foot extending laterally out from said side and over said substrate;

(c) providing a secondary etchant which when contacted with said electrically conductive layer dissolves said electrically conductive layer at a rate in the range of 0.01 to 0.10 microns per second; and, (d) applying said secondary etchant to said circuit board panel to reduce the size of said foot.

2. A process for producing a trace on a circuit board panel, said circuit board panel including a substrate, an electrically conductive layer formed on the substrate, said layer being dissolvable by a selected primary etchant, and a photoresist layer contacting and covering a portion of said electrically conductive layer, said photoresist layer being resistant to said primary etchant, said process including the steps of:

(a) providing a primary etchant which when contacted with said electrically conductive layer dissolves said electrically conductive layer at a first dissolution rate;

(b) spraying said primary etchant on said electrically conductive layer to dissolve portions of said electrically conductive layer not covered by said photoresist layer to produce a trace beneath said photoresist layer, said trace having at least one side and a foot extending laterally out from said side and over said substrate;

(c) providing a secondary etchant which when contacted with said electrically conductive layer dissolves said electrically conductive layer at a second dissolution rate slower than said first dissolution rate; and, (d) spraying said secondary etchant on said circuit board panel to reduce the size of said foot.

\* \* \* \* \*